United States Patent [19]

Tanaka et al.

[11] 4,127,887
[45] Nov. 28, 1978

[54] SAFETY TEST CIRCUIT FOR COMBUSTION CONTROL APPARATUS

[75] Inventors: Toshio Tanaka, Toride; Juichi Honda, Fujisawa; Sadao Mimori, Yoshikawamachi; Kazutoshi Ikegami, Kokubunji, all of Japan

[73] Assignee: Hitachi, Ltd., Japan

[21] Appl. No.: 825,725

[22] Filed: Aug. 18, 1977

[30] Foreign Application Priority Data

Sep. 8, 1976 [JP] Japan .................................. 51-106663

[51] Int. Cl.² ............................................... H02H 3/26
[52] U.S. Cl. ........................................ 361/86; 361/88;
324/28 SE; 324/158 T
[58] Field of Search ..................... 361/86, 88, 78, 79;
324/28 SE, 158 T, 158 R; 330/207 P; 307/130,
200 A; 431/18, 24, 26, 28, 31

[56] References Cited
U.S. PATENT DOCUMENTS

| 3,681,681 | 8/1972 | Auslander | 324/158 R X |
| 3,683,372 | 8/1972 | Horn | 431/24 X |
| 3,781,161 | 12/1973 | Schuss | 431/26 X |
| 3,927,352 | 12/1975 | Schatz | 361/86 |

Primary Examiner—J. D. Miller
Assistant Examiner—Patrick R. Salce
Attorney, Agent, or Firm—Craig & Antonelli

[57] ABSTRACT

A safety test circuit for a combustion control apparatus. This safety test circuit is used to check the off-failure of a safety transistor actuating a safety relay which acts to stop the operation of controlled units in the event of mal-combustion or the like, and also to check the on-failure of a control transistor actuating a control relay which controls the controlled units. An operation instruction signal and the collector potential of the safety transistor are applied to a logic circuit including a flip-flop and logic gates so that the off-failure of the safety transistor can be driven to check, utilizing the electrical signal propagation delay time of the elements constituting the logic circuit, before the propagation delay time has elapsed. The logic circuit is also used for similarly checking the on-failure of the control transistor. A check signal may be additionally applied to the logic circuit so that these transistors can be tested during the continuous operation of the combustion control apparatus.

9 Claims, 4 Drawing Figures

SAFETY TEST CIRCUIT FOR COMBUSTION CONTROL APPARATUS

BACKGROUND OF THE INVENTION

This invention relates to safety test circuit for a combustion control apparatus. In particular, this invention relates to a safety test circuit of the kind above described which is used for checking the off-failure (defined later) of a transistor (hereinafter referred to as a safety transistor) actuating a safety unit which acts to stop the operation of controlled units such as a solenoid-operated fuel supply valve in the event of system failure and also for checking the on-failure (defined later) of another transistor (hereinafter referred to as a control transistor) actuating a control unit which controls the controlled units such as the solenoid-operated fuel supply valve.

In a conventional combustion control apparatus controlling the combustion of, for example, a boiler or a warm air generator, safety test has been effected from the standpoint of combustion. In the safety test, however, the control transistor has only been checked for such a failure that it is maintained in its onstate when it must be turned off (which failure will be merely referred to hereinafter as on-failure), but the safety transistor has not been checked for such a failure that it is maintained in its off-state when it must be turned on (which failure will be merely referred to hereinafter as off-failure). In such a conventional safety test, additional provision of a timer circuit has been necessary for setting the time required for carrying out the safety test as described later. Further, it has been unable in the case of such a conventional safety test to carry out the safety test during the continuous operation of the combustion control apparatus although it can be done before the apparatus is placed in operation.

SUMMARY OF THE INVENTION

It is an object of the present invention to obviate such prior art inconveniences.

Another object of the present invention is to provide a novel and improved safety test circuit which can check the off-failure of the safety transistor.

Still another object of the present invention is to provide a safety test circuit which can check the on-failure of the control transistor without the provision of the timer circuit.

A further object of the present invention is to provide a safety test circuit which can conduct the safety test during the continuous operation of the combustion control apparatus.

DESCRIPTION OF THE PRIOR ART

For a better understanding of the present invention, a safety test circuit already known and employed in this field will be briefly described with reference to FIG. 1 before describing the present invention in detail.

Figure 1:
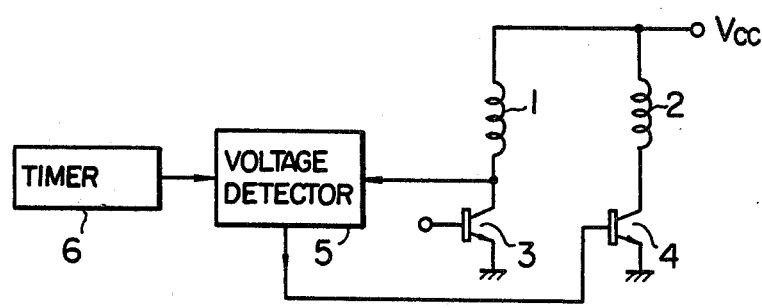
FIG. 1 is a block diagram of a prior art safety test circuit.

Referring to FIG. 1, the prior art safety test circuit comprises an electromagnetic relay 1 (hereinafter referred to as a control relay) for actuating a controlled unit, for example, a solenoid-operated fuel supply valve, firing unit or the like in a combustion control apparatus in response to an operation instruction signal, an electromagnetic relay 2 (hereinafter referred to as a safety relay) for stopping the operation of the controlled unit in the event of system failure, a control transistor 3 connected at its collector to the control relay 1, and a safety transistor 4 connected at its collector to the safety relay 2. The prior art safety test circuit further comprises a voltage detector circuit 5 and a timer circuit 6 for detecting the on-failure of the control transistor 3 before the combustion control apparatus is placed in operation. The voltage detector circuit 5 detects or checks the collector potential of the control transistor 3 which should be maintained in the off-state before the combustion control apparatus is placed in operation. The voltage detector circuit 5 decides that the control transistor 3 is normal and the combustion can be started when the detected collector potential level of the control transistor 3 is equal to the level of the power supply potential Vcc. On the other hand, the voltage detector circuit 5 decides that the control transistor 3 is abnormal when the detected collector potential level is equal to the level of the ground potential. In this latter case, the voltage detector circuit 5 applies a forward bias to the base of safety transistor 4 to turn on the same thereby actuating the safety relay 2 so as to inhibit starting of the operation of the combustion control apparatus. The timer circuit 6 provides the time required for conducting the safety test on the control transistor 3 prior to the commencement of the operation of the combustion control apparatus.

Thus, although the prior art safety test circuit has been designed for checking the on-failure of the control transistor, it has not been adapted for checking the off-failure of the safety transistor. Further, the prior art safety test circuit has been unable to check the on-failure of the control transistor once the combustion control apparatus has been placed in continuous operation.

DESCRIPTION OF THE PREFERRED EMBODIMENTS

Preferred embodiments of the present invention will now be described in detail with reference to FIGS. 2 to 4 in which the same reference numerals are used to denote the same parts appearing in FIG. 1.

Figure 2:
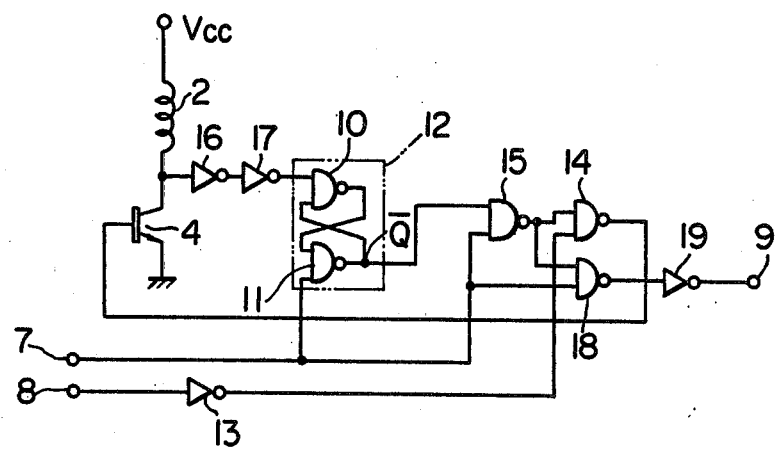
FIG. 2 is a circuit diagram of an embodiment of the safety test circuit according to the present invention.

FIG. 2 shows a first embodiment of the safety test circuit according to the present invention, and the circuit shown in FIG. 2 is used to check the off-failure of the safety transistor 4 provided for actuating the safety relay 2. The on-failure of the control transistor 3 is checked by other means not shown in FIG. 2.

An operation instruction signal instructing the operation of the combustion control apparatus is applied to an input terminal 7. This operation instruction signal has two levels, that is, a lower level or logic "0" of binary notation and a high level or logic "1" of binary notation. The combustion control apparatus is instructed to operate and not to operate when the level of the operation instruction signal is "1" and "0" respectively. The same logic applies to all the signals which will be described later. An alarm signal is applied to another input terminal 8.

In the event of system failure such as mal-combustion, misfiring or abnormal combustion at an unusually high temperature, the alarm signal of "1" level is applied to the input terminal 8 to actuate the safety transistor 4 in a manner as described later. Upon completion of the safety test, a test completion signal appears at an output terminal 9 to control the operation of the combustion control circuit (not shown) connected to the output terminal 9. When this test completion signal is of "0" level, the combustion control circuit prohibits starting of combustion, while when the test completion signal is of "1" level, the safety transistor 4 has been proved to be normal, and the combustion control circuit permits starting of combustion. A pair of NAND gates 10 and 11 constitute an RS (reset-set) flip-flop (referred to hereinafter merely as a flip-flop) 12, and the output signal of the NAND gate 11 appears at the output $\bar{Q}$ of the flip-flop 12.

The operation of the safety test circuit shown in FIG. 2 will be described first with reference to the case in which the alarm signal applied to the input terminal 8 is of "0" level indicating that all the parts of the combustion system are normal. In this case, "0" applied to the alarm signal input terminal 8 is inverted by an inverter 13, and "1" is applied from the inverter 13 to a NAND gate 14.

Suppose now that the safety transistor 4 is normal or free from the off-failure in the state above described. Before the operation takes place, the operation instruction signal applied to the input terminal 7 is of "0" level, and "1" appears from a NAND gate 15. Therefore, "0" appears at the output of NAND gate 14 to maintain the safety transistor 4 in the cut-off state. An output signal of "1" level appears from the NAND gate 11 since "0" is applied to the operation instruction signal input terminal 7. The collector potential of the safety transistor 4 is maintained at the level of the power supply potential Vcc since the safety transistor 4 is in its cut-off state. This collector potential of high or "1" level is applied to an inverter 16, and "0" appears at the output of inverter 6 to be applied to another inverter 17. An output signal of "1" level appears from the inverter 17 to be applied to one of the inputs of NAND gate 10, and "1" appearing at the output of NAND gate 11 is applied to the other input of NAND gate 10. As a result, "0" appears at the output of NAND gate 10. An output signal of "1" level appears from a NAND gate 18, and "0" appears at the output of an inverter 19. Therefore, "0" appears at the test completion signal output terminal 9.

Suppose that the operation instruction signal of "1" level is subsequently applied to the input terminal 7 in the above state of the circuit. This "1" is applied to one of the inputs of NAND gate 11 instead of "0" previously applied. However, due to the fact that the output signal of the NAND gate 10 is "0" and this output signal is applied to the other input of NAND gate 11, the flip-flop 12 is maintained in the previous state without being inverted, and the output level appearing at the output $\bar{Q}$ of flip-flop 12 is held at "1". Thus, the operation instruction signal of "1" level applied to the input terminal 7 and the output signal of "1" level appearing at the output of NAND gate 11, hence, the output $\bar{Q}$ of flip-flop 12 are simultaneously applied to the NAND gate 15, and "0" appears at the output of NAND gate 15. Consequently, "1" appears at the output of NAND gate 14 to turn on the safety transistor 4. The collector potential of the safety transistor 4 is now reduced to the ground potential level or low level, and "0" is applied to the inverter 16, with the result that "1" appears at the output of inverter 16, and "0" appears at the output of inverter 17. Since the output signal of the inverter 17 is now of "0" level, "1" appears at the output of NAND gate 10, and "0" appears at the output of NAND gate 11. The state of the flip-flop 12 is now inverted, and "0" appears at its output $\bar{Q}$. Consequently, "1" appears at the output of NAND gate 15, and "0" appears at the output of NAND gate 14 to cut off the safety transistor 4.

The collector potential of the safety transistor 4 rises up to the level of the power supply potential Vcc or high level again. Consequently, "0" appears at the output of inverter 16, and "1" appearing at the output of inverter 17 is applied to one of the inputs of NAND gate 10. However, due to the fact that the output level of the NAND gate 11 is held at "0", this "0" is applied to the other input of NAND gate 10 to hold the output level of the NAND gate 10 at "1". Consequently, "0" appears at the output of NAND gate 18, and "1" appears at the output of inverter 19 to provide the test completion signal of "1" level at the output terminal 9. The test completion signal is maintained in that level to indicate that the safety test has been completed. Since the test completion signal of "1" level appears at the output terminal 9, the combustion control circuit (not shown) connected to this output terminal 9 is now ready to operate, and the safety test on the safety transistor 4 is completed.

The length of time required for the on-off of the safety transistor 4 is the sum of the lengths of propagation delay time required for the electrical signals to propagate through the inverters 16, 17, NAND gates, 10, 11, 14, 15 and safety transistor 4 constituting part of the circuit shown in FIG. 2. The electrical signal propagation delay time (referred to hereinafter merely as a propagation delay time) of each of such circuit elements is generally in the order of several nanoseconds to several ten nanoseconds. Thus, the total propagation delay time is very short compared with the length of time required for turning on the safety relay 2 from its off-state, and the safety relay 2 would not be completely turned on within this total propagation delay time. Therefore, the safety test can be reliably performed before the combustion control apparatus is placed in operation.

Consider then the case in which the off-failure occurs in the safety transistor 4. As described above, the safety transistor 4 is maintained in its cut-off state and the test completion signal of "0" level appears at the output terminal 9, when the operation instruction signal of "0" level is applied to the input terminal 7. Then, when the operation instruction signal of "1" level is applied to the input terminal 7, "1" appears at the output of NAND gate 14 to be applied to the base of safety transistor 4 to turn on the same. However, due to the fact that the off-failure has occurred in the safety transistor 4, its collector potential remains at the level of the power supply potential Vcc or "1", and "0" appears at the output of inverter 16. An output signal of "1" level appears from the inverter 17, and the NAND gate 10 is maintained in the previous state. The state of the flip-flop 12 is not inverted, and "1" appears at its output $\bar{Q}$. Thus, "0" appears at the output of NAND gate 15, "1" appears at the output of NAND gate 18, and "0" appears at the output of inverter 19. The test completion signal of "0" level appears thus at the output terminal 9 to indicate that the safety test has not yet been completed. Therefore, the combustion control circuit is maintained in its deenergized state, and the combustion does not take place.

Consider then the case in which an abnormal situation occurs during combustion although the safety transistor 4 is normal and the combustion control circuit is making its combustion control operation. The alarm signal of "1" level is now applied to the input terminal 8, and "0" appears at the output of inverter 13. Consequently, "1" appears at the output of NAND gate 14 to turn on the safety transistor 4, and the safety relay 2 is actuated to stop the operation.

In this manner, the off-failure of the safety transistor 4 can be checked within the total propagation delay time of the gate circuit elements. Therefore, any especial timer circuit is unnecessary, and the safety test can be completed within a very short time.

In FIG. 2, the relay 2 is illustrated as a part of the embodiment of the present invention. However, it will be readily understood that this relay 2 need not necessarily be included as a part of the embodiment, and an output terminal for actuating this separate relay 2 may be provided in this embodiment.

Figure 3:
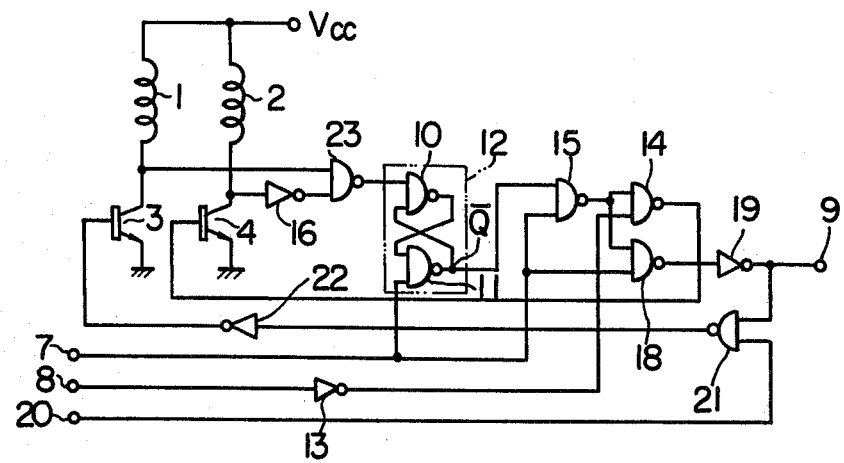
FIG. 3 is a circuit diagram of another embodiment of the present invention.

FIG. 3 shows another embodiment of the present invention which is adapted to check on-failure of the control transistor 3 in addition to the check of the off-failure of the safety transistor 4. In FIG. 3, the same reference numerals are used to denote the same parts appearing in FIG. 2.

Referring to FIG. 3, a control signal for actuating the control relay 1 is applied to an input terminal 20, and this control signal is applied from the combustion control circuit (not shown). The control signal of "1" level is applied to the input terminal 20 in a predetermined period of time after the operation instruction signal of "1" level has been applied to the input terminal 7. Thus, when, for example, a pre-purging means is included in the combustion control apparatus, the operation instruction signal of "1" level is applied to the input terminal 7 upon turning on the power supply, and the load such as the blower is driven in response to the appearance of the test completion signal of "1" level at the output terminal 9 for the purpose of pre-purging, after which the combustion control circuit (not shown) generates the control signal of "1" level to actuate the controlled unit such as the solenoid-operated control valve.

The manner of checking the off-failure of the safety transistor 4 is entirely similar to that described with reference to FIG. 2. Also, the circuit operation in response to the application of the alarm signal of "1" level to the input terminal 8 is entirely similar to that described with reference to FIG. 2.

The operation of the safety test circuit shown in FIG. 3 will be described first with reference to the case in which the alarm signal applied to the input terminal 8 is of "0" level, and both the control transistor 3 and the safety transistor 4 are normal. Before the operation of the combustion control apparatus takes place, the operation instruction signal of "0" level is applied to the input terminal 7, and the test completion signal of "0" level appears at the output terminal 9. Therefore, "1" appears at the output of a NAND gate 21, and "0" appears at the output of an inverter 22 to maintain the control transistor 3 in the cut-off state. The collector potential of "1" level is applied to one of the inputs of a NAND gate 23. The safety transistor 4 is also maintained in its cut-off state as described with reference to FIG. 2, and its collector potential of "1" level is applied to the inverter 16 to apply "0" from the inverter 16 to the other input of NAND gate 23. Consequently, "1" appears at the output of NAND gate 23. This part of FIG. 3 differs only from FIG. 2 in that the inverter 17 is replaced by the NAND gate 23. Thus, the test completion signal of "0" level appears at the output terminal 9 in entirely the same manner as that described with reference to FIG. 2.

The operation instruction signal of "1" level is subsequently applied to the input terminal 7. Since the control transistor 3 is maintained in the cut-off state, its collector potential has a high or "1" level corresponding to that of the power supply potential Vcc, and the output level of the NAND gate 23 is held at "1". In response to the application of the operation instruction signal of "1" level to the input terminal 7, the safety transistor 4 is turned on as described with reference to FIG. 2, and its collector potential of "0" level is applied to the inverter 16, with the result that "1" appears at the output of inverter 16. Consequently, "1's" are applied to the two inputs of NAND gate 23, and "0" appears at the output of NAND gate 23 to invert the state of the flip-flop 12. Thereafter, the safety test on the safety transistor 4 is carried out and completed in entirely the same manner as that described with reference to FIG. 2. Upon completion of the safety test on the safety transistor 4, the test completion signal of "1" level appears at the output terminal 9 to drive the load connected to the output terminal 9.

Upon lapse of a predetermined period of time, the control signal of "1" level is applied to the input terminal 20. Consequently, "0" appears at the output of NAND gate 21, and "1" appears at the output of inverter 22 to turn on the control transistor 3 so that the combustion control apparatus can continue its steady operation.

Suppose that the control signal of "0" level instead of "1" level is applied to the input terminal 20 during the steady operation. In such a case, "1" appears at the output of NAND gate 21, and "0" appears at the output of inverter 22 to cut off the control transistor 3. In this manner, the control transistor 3 can be turned on and off by the control signal applied to the input terminal 20.

The circuit operation will next be described with reference to the case in which the on-failure occurs in the control transistor 3 although the safety transistor 4 is normal. The safety test is initiated in response to the application of the operation instruction signal of "1" level to the input terminal 7. Since the control transistor 3 is conducting, its collector potential has a low or "0" level corresponding to the ground potential level, and "0" is applied to one of the inputs of NAND gate 23. Thus, although the safety transistor 4 is normal, and "1" is applied to the other input of NAND gate 23 from the inverter 16, the output level of the NAND gate 23 is held at "1" so that the state of the flip-flop 12 would not be inverted. Consequently, "1" appears at the output $\bar{Q}$ of flip-flop 12, and "0" appears at the output of NAND gate 15. An output signal of "1" level appears from the NAND gate 18, and "0" appears at the output of inverter 19. Thus, the test completion signal of "0" level appears at the output terminal 9 to indicate that the safety test has not been completed yet. This situation arises due to the on-failure of the control transistor 3, and the test completion signal remains in that level. Consequently, "1" appears at the output of NAND gate 14 to turn on the safety transistor 4, and the safety relay 2 is actuated to stop the operation.

Description will next be directed to the case in which the off-failure occurs in the safety transistor 4 although the control transistor 3 is normal. In this case, "1" and "0" are applied to the two inputs respectively of NAND gate 23, and its output level is held at "1" without inverting the state of the flip-flop 12. As in the above case, therefore, the test completion signal of "0" level appears at the output terminal 9 to stop the operation. Even when the control signal of "1" level is subsequently applied to the input terminal 20 in the above situation, "1" appears at the output of NAND gate 21, and "0" appears at the output of inverter 22 to prevent the control transistor 3 from conducting.

The circuit shown in FIG. 3 is therefore advantageous in that both the off-failure of the safety transistor 4 and the on-failure of the control transistor 3 can be checked within a very short period of time. The circuit eliminates the necessity for any especial timer circuit and is especially suitable for application to a combustion control apparatus including a pre-purging means.

It will be apparent from the above description that the operation instruction signal may include the control signal when it may be unnecessary to actuate the solenoid-operated control valve in a predetermined period of time as described hereinbefore. Further, if unnecessary, the test completion signal output terminal 9 may be eliminated. However, provision of the test completion signal output terminal 9, operation instruction signal input terminal 7 and control signal input terminal 20 in the safety test circuit is preferable in that the circuit finds universal applications.

Figure 4:
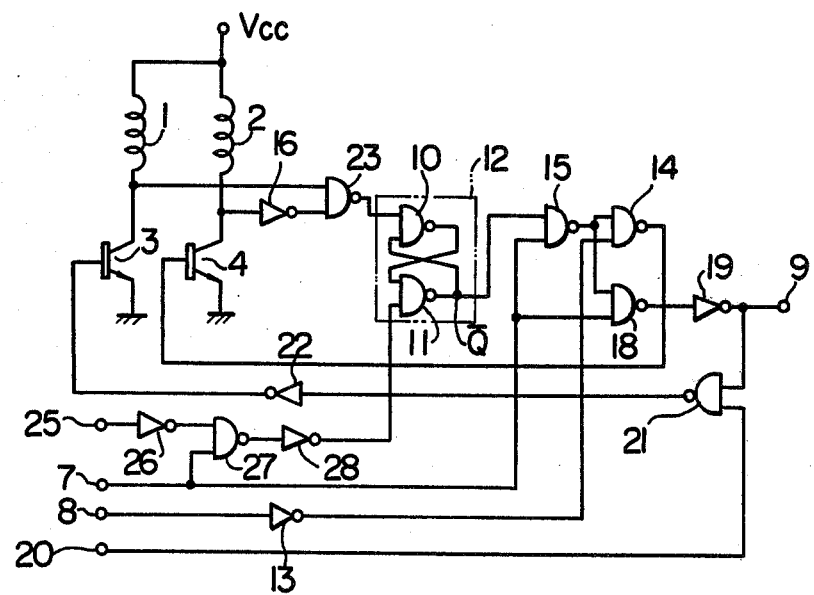
FIG. 4 is a circuit diagram of still another embodiment of the present invention.

FIG. 4 shows still another embodiment of the present invention which is adapted to check the on-failure of the control transistor 3 and the off-failure of the safety transistor 4 during continuous operation of the combustion control apparatus. In FIG. 4, the same reference numerals are used to denote the same parts appearing in FIG. 3.

Referring to FIG. 4, a check signal for this purpose is applied to an input terminal 25 and includes a positive pulse having a duration which is shorter than the length of time required for the operation of the relays. This check signal is normally of "0" level, and a high level or "1" of very short duration appears at a necessary time.

When the check signal applied to the input terminal 25 is of "0" level, the manner of testing the control transistor 3 and safety transistor 4 is entirely the same as that described with reference to FIG. 3. Thus, when the level of the operation instruction signal applied to the input terminal 7 is changed from "0" to "1", the safety test on these transistors 3 and 4 is started. The level of the test completion signal appearing at the output terminal 9 is changed from "0" to "1" to indicate the completion of the safety test when these transistors 3 and 4 have been proved to be normal. The control signal of "1" level is subsequently applied to the input terminal 20 to permit the steady operation of the combustion control apparatus.

Suppose now that a pulse or "1" appears in the check signal applied to the input terminal 25 during the steady operation. Consequently, "0" appears at the output of an inverter 26, and "1" appears at the output of a NAND gate 27. An output signal of "0" level appears from an inverter 28, and such output signal is applied to one of the inputs of NAND gate 11. Consequently, the flip-flop 12 is reset, and "1" appears at the output $\overline{Q}$ of flip-flop 12. While the level of the check signal applied to the input terminal 25 is immediately restored to "0" from "1", the output level appearing at the output $\overline{Q}$ of flip-flop 12 is held at "1". This output signal is applied through the NAND gate 15 and 14 to the base of safety transistor 4 to turn on the same and through the NAND gates 15, 18, inverter 19, NAND gate 21 and inverter 22 to the base of control transistor 3 to cut off the same. The collector potentials of these transistors 3 and 4 at this time are applied to the associated circuit elements to complete the safety test instantaneously as in the safety test performed in the operation starting stage. Although signals are applied to the coils of the control relay 1 and safety relay 2, the loads (not shown) controlled by these relays would not be driven before the completion of the safety test, because the complete action of the secondary mechanical contacts of these relays 1 and 2 requires a length of time which is very longer than that required for the operation of the logic elements in the circuit.

The output level appearing at the output $\overline{Q}$ of flip-flop 12 is held at "1" when the safety test result has proved that any one of the transistors 3 and 4 is abnormal. When the on-failure of the control transistor 3 is detected, the safety transistor 4 is actuated to stop the operation. On the other hand, when the off-failure of the safety transistor 4 is detected, the test completion signal of "0" level appears at the output terminal 9 to cut off the control transistor 3 thereby stopping the operation.

It will thus be seen that the safety test on the control transistor 3 and safety transistor 4 can be conducted at any desired time during the steady operation of the combustion control apparatus.

We claim:

1. A safety test circuit for a combustion control apparatus, comprising:
output terminal means for connection with the combustion control apparatus in use;
a transistor having a collector, an emitter and a base, said transistor being for actuating in its conductive state an external safety unit which acts when actuated to stop the operation of an external combustion unit in the event of occurrence of an abnormal situation during continuous combustion;
means for applying a potential across the collector and emitter of said transistor; and
logic circuit means adapted to receive a first signal representing the potential at the collector of said transistor and a second signal applied externally to instruct the operation of said combustion control apparatus, said logic circuit including a first output connected to the base of said transistor, a second output connected to said output terminal means, means for generating, in response to the application of said second signal, a pulse signal having a pulse duration shorter than the length of time required for said external safety unit to be actuated completely in response to the conduction of said transistor, utilizing the electrical signal propagation delay time of part of circuit elements constituting said logic circuit means, and means for applying an actuating signal from said first output to the base of said transistor during the lasting period of said pulse signal to render said transistor conductive, whereby said transistor is checked for its off-failure by detecting the level of said first signal which changes depending on whether said transistor has conducted or not and upon the completion of said off-failure check an output signal is produced from said second output of said logic circuit means.

2. A safety test circuit as claimed in claim 1, wherein a third signal indicating the occurrence of the abnormal situation is applied externally to said logic circuit means, and in response to the application of said third signal, said actuating signal is applied from said first output to the base of said transistor during the period of said thrid signal to render said transistor conductive.

3. A safety test circuit as claimed in claim 1, wherein said logic circuit means includes first logic gate means, flip-flop means connected to said first logic gate means, and second logic gate means connected to said flip-flop means, said first signal being applied to said first logic gate means, said second signal being applied to said flp-flop means and said second logic gate means, said second logic gate means having a first output connected to the base of said transistor and a second output connected to said output terminal means.

4. A safety test circuit as claimed in claim 3, wherein said flip-flop means is an RS flip-flop having a first input connected to the output of said first logic gate means and a second input receiving said second signal.

5. A safety test circuit for a combustion control apparatus comprising:
output terminal means for connection with the combustion control apparatus in use;
a transistor having a collector, an emitter and a base, said transistor being for actuating in its conductive state an external safety unit which acts when actuated to stop the operation of an external combustion unit in the event of occurrence of an abnormal situation during continuous combustion;
means for applying a potential across the collector and emitter of said transistor; and
logic circuit means adapted to receive a first signal representing the potential at the collector of said transistor and second signal applied externally to instruct the operation of said combustion control apparatus, said logic circuit means including a first output connected to the base of said transistor, a second output connected to said output terminal means, means for generating, in response to the application of said second signal, a pulse signal having a pulse duration shorter than the length of time required for said external safety unit to be actuated completely in response to the conduction of said transistor, utilizing the electrical signal propagation delay time of part of circuit elements constituting said logic circuit means, and means for applying an actuating signal from said first output to the base of said transistor during the lasting period of said pulse signal to render said transistor conductive, whereby said transistor is checked for its off-failure by detecting the level of said first signal which changes depending on whether said first transistor has conducted or not, and then, after applied, said second signal is once removed for a length of time shorter than that required for an electromagnetic relay which controls the operation of said combustion unit to completely actuate said combustion unit to come to its off-state.

6. A safety test circuit as claimed in claim 5, wherein said logic circuit means includes first logic gate means, an RS flip-flop connected to said first logic gate means, and second logic gate means connected to said flip-flop, said first signal being applied to said first logic gate means, said second signal being applied to said flip-flop and said second logic gate means, said second logic gate means having first output connected to the base of said transistor, and a second output connected to said output terminal means, said second signal being applied in the form of a continuous signal lasting for the length of time required for the continuous operation of said combustion control apparatus, and wherein during the lasting period of said second signal, said second signal is applied to said flip-flop in the form of negative going pulse signal having a pulse duration shorter than a length of time required for said electromagnetic relay to completely actuate said combustion unit to come to its off-state, in response to a third signal which is applied externally.

7. A safety test circuit for a combustion control apparatus comprising:
output terminal means for connection with the combustion control apparatus in use;
a first transistor having a collector, an emitter and a base, said first transistor being for actuating in its conductive state an external safety unit which acts to stop the operation of an external combustion unit when actuated in the event of occurrence of an abnormal situation during continuous combustion;
a second transistor having a collector, an emitter and a base, said second transistor being for actuating in its conductive state an electromagnetic relay which acts to start the operation of said external combustion unit when actuated;
means for applying a potential across the collector and emitter of each of said first and second transistors; and
logic circuit means adapted to receive a first signal representing the potential at the collector of said first transistor, a second signal representing the potential at the collector of said second transistor, a third signal applied externally to instruct the operation of said combustion unit, said logic circuit means including a first output connected to the base of said first transistor, a second output connected to the base of said second transistor, a third output connected to said output terminal means, means for applying, in response to the application of said third signal, an actuating signal from said second output to the base of said second transistor to render said second transistor conductive, whereby said second transistor is checked for its on-failure by detecting the change in the level of said second signal to prove the fact that said second transistor has been maintained in the off-state, means for generating, in response to the application of said third signal, a pulse signal having a pulse duration shorter than the length of time required for said external safety unit to be actuated completely in response to the conduction of said first transistor, utilizing the electrical signal propagation delay time of part of circuit elements constituting said logic circuit means, and means for applying an actuating signal from said first output to the base of said first transistor during the lasting period of said pulse signal to render said first transistor conductive, whereby said first transistor is checked for its off-failure by detecting the level of said first signal which changes depending on whether said first transistor has conducted or not.

8. A safety test circuit as claimed in claim 7, wherein said logic circuit means includes first logic gate means, an RS flip-flop connected to said first logic gate means, and second logic gate means connected to said flip-flop, said first and second signals being applied to said first logic gate means, said third signal being applied to said flip-flop and said second logic gate means, and said second logic gate means having a first output connected to the base of said first transistor, a second output connected to the base of said second transistor, and a third output connected to said output terminal means, and wherein an output signal is produced from said second output in response to a fourth signal applied to said second logic gate means.

9. A safety test circuit as claimed in claim 8, wherein said second and third outputs of said second logic gate means generate their output signals after said first transistor has been checked for its off-failure by the output signal generated from said first output.

* * * * *